GLASS MELT-THROUGH DIFFUSIONS

Filed June 23, 1970

INVENTOR:
DALE M. BROWN,
by [signature]
HIS ATTORNEY

United States Patent Office 3,764,411
Patented Oct. 9, 1973

3,764,411
GLASS MELT-THROUGH DIFFUSIONS

Dale M. Brown, Schenectady, N.Y., assignor to General Electric Company

Filed June 23, 1970, Ser. No. 49,073
Int. Cl. H01l 7/46
U.S. Cl. 148—188 5 Claims

ABSTRACT OF THE DISCLOSURE

A process for diffusing impurity dopants into a semiconductor substrate from an impurity containing (doped) glass film, and in particular through an intermediate undoped insulating glass film, such as an oxide of the semiconductor substrate is described. In one embodiment, diffusion of boron atoms into a silicon substrate is described as comprising the steps of providing a boron trioxide doped silicon dioxide glass containing between approximately 20 and 50 molar percent of boron trioxide over a silicon dioxide layer overlying a silicon substrate and heating the substrate to cause the doped glass to undergo an abrupt pseudo change in state from a highly viscous glassy state to a low viscosity flowable glassy state and to dissolve the adjacent undoped glass as the boron trioxide melts—through the undoped glass toward the surface of the silicon substrate whereupon free boron atoms diffuse into the substrate.

The present invention relates to semiconductor fabrication processes and more particularly to a novel method for introducing conductivity modifying impurities into semiconductor material.

One of the basic process steps in the fabrication of semiconductor devices is the introduction of conductivity modifying impurities into the semiconductor material. A widely used technique for achieving conductivity modified regions is impurity diffusion from a diffusion source. Basically, impurity diffusion requires a suitable impurity source, a means for transporting the impurities to the semiconductor material and a controlled environment for producing desired diffusion regions. Over the years, different diffusion procedures providing varying degrees of control of diffusion depths and concentrations have been devised. Typically, diffusion of conductivity modifying impurities into a semiconductor material such as silicon is performed at temperatures from approximately 800° C. to 1200° C. Various materials in either solid, liquid, or gaseous state have produced acceptable diffusion results. The number and variety of existing semiconductor devices is clear evidence of the success achieved by solid state diffusion processes.

While present-day diffusion processes have produced commendable results, numerous problems still remain unsolved. For example, in fabricating field-effect transistors of the metal-oxide-semiconductor type, the formation of the source and drain regions is generally achieved by etching holes through the oxide layer and gaseously diffusing impurities into the semiconductor substrate to form the source and drain regions. This method, however, has several shortcomings; in particular, in etching the holes through the oxide, undercutting the gate electrode frequently occurs. Additionally, during the gaseous diffusion process, it is not uncommon to exceed the solid solubility of the semiconductor material and hence produce dislocations in the semiconductor. These and other problems with this method of fabrication substantially reduce the yield of transistors produced in batch fabrication processes. One method which overcomes these difficulties is the formation of source and drain regions by diffusing through the oxide or insulating layer without forming any apertures therein. This method overcomes the aforementioned problems and provides suitable results, however, the diffusion time is quite long.

Another problem of present-day diffusion processes is the creation of stresses between diffusion masking films and the underlying semiconductor substrate. These stresses are caused by differences in thermal coefficients of expansion between the two materials. Such stresses are sufficient to cause cracks or fractures to occur in the masking films and sometimes even produce large numbers of dislocations in the semiconductor material itself. As a result of this problem, the number of useful devices produced from a batch fabrication process is considerably reduced.

It is therefore an object of this invention to provide a process for diffusing impurities through undoped glasses overlying semiconductor substrates which overcomes the aforementioned problems of the prior art.

It is a further object of this invention to provide a novel process for diffusing impurity dopants through an insulating layer overlying a semiconductor substrate with substantially reduced diffusion times.

It is yet another object of this invention to provide a process for the diffusion of impurities from an impurity-doped glass film through an undoped glass film by the dissolution of the undoped glass at elevated temperatures.

It is yet another object of this invention to provide a process to reduce the time of impurity diffusion through undoped glasses, to reduce strain on diffusion barrier films and the underlying semiconductor substrate and to permit the introduction of impurity dopants into the semiconductor substrate without exceeding the solid solubility of the semiconductor material.

These and other objects of the instant invention are achieved in accord with one embodiment thereof by providing a semiconductor material having a layer of undoped glass thereover with a layer of a semiconductor impurity-doped glass layer including high softening temperature and low softening temperature glasses. At elevated temperatures the semiconductor impurity doped glass rapidly dissolves the layer of undoped glass and carries the semiconductor impurities to the surface of the semiconductor material for diffusion therein. For example, a layer of boron trioxide doped silicon dioxide glass containing between approximately 20 and 50 molar percent of boron trioxide is formed over an undoped silicon dioxide glass-covered semiconductor substrate of silicon. At temperatures above approximately 800° C., the boron doped glass undergoes an abrupt pseudo change in state from a highly viscous glassy state to a low viscosity flowable glassy state with the attendant rapid dissolution of the adjacent undoped silicon dioxide glass by the diffusion of boron trioxide therein. The boron trioxide moves to the surface of the silicon substrate whereupon free boron atoms diffuse into the substrate.

The novel features believed characteristic of the present invention are set forth in the appended claims. The invention itself, together with further objects and advantages thereof, may be best understood by reference to the following detailed description taken in connection with the appended drawing in which:

Figure 1:
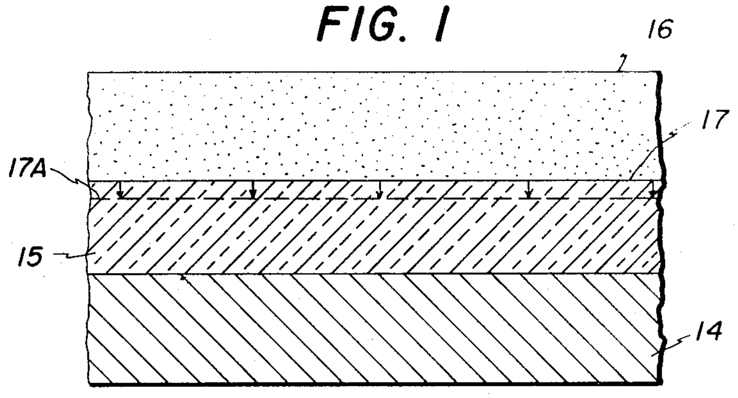
FIG. 1 is a partial sectional view of a typical semiconductor substrate with undoped and doped glass films overlying the substrate.

In accord with one embodiment of my invention, I have discovered that at elevated temperatures certain combinations of high softening temperature and low softening temperature glasses when overlying certain undoped glasses cause a rapid dissolution of the undoped glasses. When semiconductor impurities are added to or otherwise form a part of the combination of glasses, the rapid dissolution of the undoped glass is accompanied by the rapid movement of the semiconductor impurities into the undoped glass. This phenomenon which I prefer to call "glass melt-through" can be better understood by reference to FIG. 1 of the drawing wherein there is illustrated a greatly enlarged partial side view of a semiconductor device being fabricated in accord with one embodiment of the invention. The device comprises a semiconductor material 14 such as silicon, for example, with an insulating layer 15 such as thermally grown silicon dioxide glass thereover. A layer of a semiconductor impurity doped glass 16, such as boron trioxide doped silicon dioxide, is deposited over the insulating layer 15 forming an interface 17 between the two layers. In accord with this embodiment of my invention, I have discovered that at temperatures above approximately 800° C., boron trioxide doped silicon dioxide glass containing between approximately 20 and 50 molar percent of boron trioxide exhibits an abrupt pseudo change in state from a highly viscous hard glassy state to a very low viscosity soft flowable glassy state. More specifically, I have found that at temperatures between approximately 800° C. and 1300° C., boron doped glass with the above concentrations becomes very soft flowable (i.e., less viscous) and causes a rapid dissolution of the adjacent silicon dioxide layer 15 along the interface 17. The dissolution of the silicon dioxide glass is accompanied by the diffusion or introduction of boron trioxide impurities therein. As the diffusion continues, the interface 17 moves rapidly toward the silicon substrate 14. FIG. 1 illustrates this movement by the dashed line 17A. By the movement of the interface or front 17A, the previously undoped silicon dioxide 15 becomes doped with the boron trioxide. Depending upon the concentration of the boron trioxide in the boron doped glass and the thickness of the undoped glass, as will be described hereinafter, the interface 17 can be made to move to and coincide with the surface of the silicon substrate 14 whereupon free boron atoms diffuse into the substrate.

By way of example, a silicon dioxide film 15 of 800 A. thickness is dissolved from one surface to the other by an overlying layer of boron trioxide doped silicon dioxide glass of 3000 A. thickness comprising approximately 30 molar percent of boron trioxide in approximately 2 minutes at a temperature of 1050° C. Those skilled in the art can readily appreciate that such a rapid rate of dissolution of the silicon dioxide film can be employed advantageously to reduce the time necessary for diffusion of semiconductor impurities into underlying semiconductor material.

Before considering in detail the parameters of my invention, I would like to distinguish my invention which I call "glass melt-through diffusion" or just "melt-through diffusion" from that of prior art diffusion processes. As used in the specification and claims, glass melt-through diffusion is defined as the rapid dissolution of an undoped insulating layer by an adjacent layer of low softening temperature impurity doped glass at elevated temperatures. In the case of boron trioxide doped silicon dioxide, for example, this melt-through condition occurs for boron trioxide concentrations of between approximately 20 and 50 molar percent of boron trioxide in the silicon dioxide glass and at temperatures between about 800° C. and 1300° C. Below concentrations of approximately 20 molar percent, boron doped glass does not exhibit the melt-through phenomenon, but rather diffuses through silicon dioxide in accord with solid state diffusion parameters. Above concentrations of approximately 50 molar percent boron doped glass becomes hygroscopic and very soluble in water. Accordingly, when using boron doped glass, the melt-through diffusion of my invention is practised with concentrations of boron trioxide ranging between 20 and 50 molar percent.

For purposes of clairity, I described my invention as being practised with boron trioxide doped silicon dioxide glass; however, it is to be understood that my invention is not limited solely to this type doped glass. As will become apparent from the following detailed description, other combinations of high softening temperature and low softening temperature glasses exhibiting the desired characteristics of glass melt-through can also be used. For example, lead oxide doped arsenic trioxide glass, phosphorus pentoxide doped silicon dioxide glass, lead oxide doped borosilicate glass, antimony trioxide doped silicon dioxide glass, bismuth trioxide doped silicon dioxide glass, tin oxide doped silicon dioxide glass and zinc doped lead silicate or borosilicate may also be used. With certain glasses, lead oxide may be added to lower still further the viscosity of the doped glass whenever desired. Further, in addition to insulating layers of silicon dioxide, other materials such as, for example, silicon monoxide and aluminum oxide are also useful. Additionally, other Class IV semiconductor materials such as, for example, germanium and Class V semiconductor materials such as gallium arsenide and gallium phosphide may also be used. Accordingly, my invention is not limited to any specific material or combination of materials illustrated by way of example.

Referring again to FIG. 1 of the drawing, it can be appreciated that at elevated temperatures, the interface 17A moves toward the surface of the silicon substrate 14. In the case of boron doped glass, a chemical reaction takes place between the boron trioxide and the silicon which produces free boron atoms. These boron atoms then diffuse into the silicon substrate. More specifically, the reaction which takes place at the silicon surface is as follows:

$$2B_2O_3+3Si\rightarrow 4B+3SiO_2$$

From the above equation it can be readily appreciated that free boron atoms are given up at the silicon interface and these atoms diffuse quickly into the silicon substrate 14.

After the boron trioxide "melts through" the silicon dioxide layer, the diffusion of boron into the silicon is substantially similar to other diffusion processes. A particularly advantageous feature of my invention resides in the rapid dissolution of the silicon dioxide layer by the boron trioxide doped silicon dioxide so that the boron trioxide is available at the surface of the substrate.

Another advantage of the instant invention is that the interface between the silicon substrate 14 and the silicon dioxide layer 15 is no longer rigid. Since the silicon dioxide has become soft and flowable, any stresses which might otherwise be created are substantially reduced if not completely eliminated.

Figure 2:
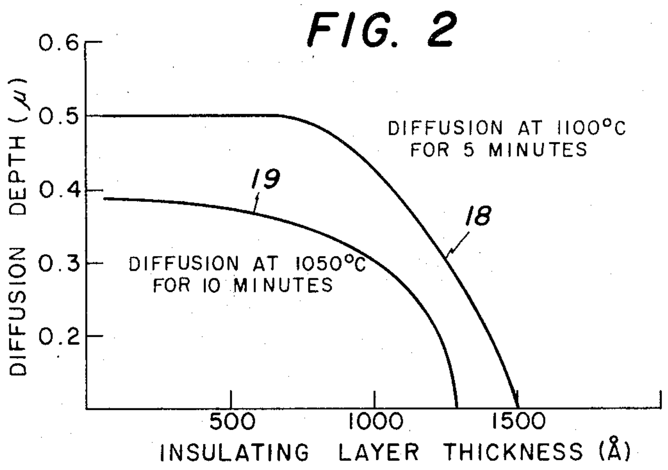
FIG. 2 is a graphic illustration of the variation in diffusion depths with various insulating layer thicknesses for substantially constant surface concentrations.

Considering now in more detail the parameters surrounding the instant invention, reference is made to FIG. 2 which illustrates the variation in impurity diffusion depth in a silicon substrate as a function of silicon dioxide thickness for dfferent diffusion times and temperatures with a 3000 A. thick layer of boron trioxide doped glass containing 30 molar percent of boron trioxide. More specifically, FIG. 2 illustrates the short diffusion times required to obtain a given diffusion depth with a specific surface concentration, $C_s$, in a semiconductor substrate. As illustrated, curve 18 shows the variation in diffusion depth with oxide thickness when the diffusion is performed at 1100° C. for 5 minutes. In this situation, surface concentrations, $C_s$, varied from approximately 3 to $5\times10^{20}$ atoms/cc. Curve 19 shows the variation in diffusion depth with oxide thickness diffusion performed at 1050° C. for 10 minutes. Surface concentrations in this case ranged from approximately 2 to $4\times10^{20}$ atoms/cc.

For oxide thickness of less than approximately 1000 A., I have found that the glass melt-through diffusion process of my invention produces substantially the same diffusion depths and substantially the same surface concentrations as those obtained when the boron doped glass is placed directly over the silicon substrate. This characteristic of the glass melt-through process is particularly significant in the fabrication of field-effect transistors, for example, since it is now unnecessary to etch away the oxide in forming source and drain regions of the transistors. This feature will be pointed out more clearly hereinafter.

Another advantage of the glass melt-through process of my invention can be best understood by first considering the problems of the prior art. More specifically, in prior art diffusion processes employing an intermediate layer of undoped glass over the semiconductor material into which impurities are to be diffused, it is generally necessary to maintain close control over the thickness of the undoped glass because impurity diffusion through the undoped glass is an appreciable portion of the total diffusion time. In accord with my invention, however, impurities melt-through the undoped oxide layer in only a small fraction of the total diffusion time. Accordingly, small variations in oxide thickness are unimportant.

More specifically, in accord with my invention of glass melt-through diffusion, the coefficient of diffusion of impurities through undoped glass is of the same order of magnitude as the diffusion of impurities through semiconductor material. For example, for melt-through concentrations of boron trioxide (approximately 20 to 50 molar percent), at temperatures of between 1000° C. to 1100° C., the diffusion coefficient is greater than $2\times10^{-15}$ cm.$^2$ sec. to $2\times10^{-14}$ cm.$^2$/sec., respectively. For solid state diffusion concentrations (i.e., less than approximately 20 percent of boron trioxide), the diffusion coefficient is equal to or less than about $4\times10^{-17}$ cm.$^2$/sec. This vast difference in diffusion coefficients accounts for the rapid diffusion times associated with the glass melt-through diffusion process of my invention. Variations in oxide thickness therefore are unimportant in determining the depth of any resulting diffusion regions in an underlying substrate. Accordingly, diffusion regions of selected depths are very easily controlled and very readily reproduced.

Another particularly desirable characteristic of the melt-through diffusion process is the substantially small diminution of semiconductor surface concentrations, $C_S$, obtained for undoped insuating film thicknesses of up to about 1000 A. This advantageous property is believed to result from the availability of sufficient impurities from the doped glass layer to dissolve the intermediate undoped glass layer as well as provide enough free impurity atoms at the semiconductor surface to produce the desired surface concentration. Rapid decreases in surface concentration occur as the "masking condition" is approached; that is, there is a thickness of undoped glass which is sufficient to prevent the impurities from reaching the surface of the semiconductor material. This condition is illustrated in FIG. 2 by the interception of each curve with the abscissa.

Without limiting my invention to any particular theory of operation, it is believed that the masking condition is approached as a result of dilution of the impurity doped glass. For example, as the impurity doped glass melts through or dissolves the adjacent undoped glass, impurities are given up to the undoped glass. As the concentration of impurities drops below a value sufficient to sustain the melt-through condition, the impurity doped glass becomes more viscous and the dissolution of the undoped glass stops. This condition, then, is the masking condition whereby the glass melt-through process of my invention is self-limiting. This feature can be advantageously utilized, for example, to limit the extent of lateral diffusion of impurities under the edges of a self-registered gate electrode of a field-effect transistor.

Those skilled in the art can readily appreciate that the aforementioned desirable characteristics of the instant invention have wide application to the fabrication of semiconductor devices. For example, the fabrication of semiconductor devices such as metal oxide semiconductor field-effect transistors is now significantly improved since, in the light of my instant invention, it is no longer necessary to remove the oxide for the diffusion of source and drain regions adjacent the gate region and further in situations in which diffusion through the oxide is employed, the diffusion process of the instant invention reduces the diffusion time to minutes as opposed to several hours in the case of solid state diffusion techniques.

Although FIG. 2 illustrates the variation in certain parameters relating to my invention. It is to be understood that the specific values given are not by way of limitation, but merely are illustrative of one set of parameters. In fact, in practising my invention, undoped insulating layers of between approximately 400 A. and 2000 A. and doped glass thicknesses of between approximately 2000 A. and 10,000 A. are suitable. Acceptable diffusion times range between approximately 5 minutes and 5 hours at temperatures of between approximately 600° C. and 1300° C., with the shorter times occurring for thinner undoped glass thicknesses and high impurity concentration glasses.

Figure 3:
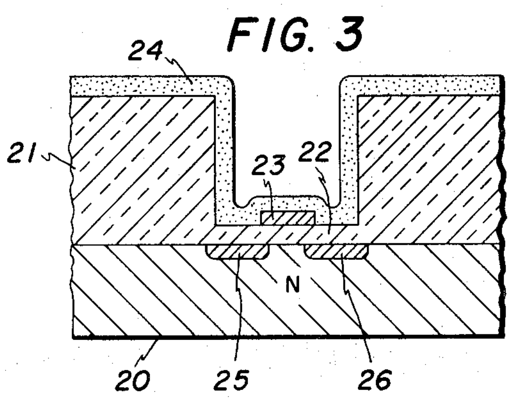
FIG. 3 is a partial sectional view of a typical semiconductor device fabricated by diffusion from a doped glass overlying an oxide-covered semiconductor substrate.

By way of example, another embodiment of my invention is illustrated in FIG. 3. Here, a P-channel enhancement mode field-effect transistor is illustrated as comprising a semiconductor substrate 20 of n-type conductivity with a thick undoped oxide 21 overlying one surface of the semiconductor substrate. A portion of the thick oxide which may, for example, be 10,000 A. thick, is etched away so as to produce a device region 22. Within the device region 22, the substrate is oxidized to produce an oxide thickness of 1000 A. A gate electrode 23, such as molybdenum, tungsten, silicon or other useful materials, is formed within the region 22 and the entire surface of the oxide 21 is covered with a layer of boron trioxide doped glass 24 containing approximately 35 molar percent of boron trioxide to a thickness of approximately 3000 A. This may be done conveniently by flowing a mixture of oxygen, diborane ($B_2H_6$) and silane ($SiH_4$) diluted to 1 percent with argon over the heated substrate to produce the desired thickness. This method is more fully disclosed in my copending application Ser. No. 40,287, filed May 25, 1970. Alternately, the boron doped glass may be deposited by other methods known in the art. By whatever method employed, the entire substrate is then placed in a diffusion chamber and the temperature elevated to approximately 1100° C. for approximately 15 minutes, whereupon the boron trioxide doped glass 24 melts-through the adjacent silicon dioxide 21. As a result of the different oxide thicknesses, however, the boron trioxide only melts-through the oxide to the surface of the n-type silicon substrate 20 in the region 22. Even here, however, the thickness of gate electrode 23 masks the diffusion of boron trioxide to the substrate 20. Therefore, only in source and drain regions 25 and 26, respectively, is the conductivity of the substrate altered. By etching through the boron doped glass 24 and making contacts to the source and drain regions and the gate electrode, a field-effect transistor is produced.

To illustrate yet another example of my invention, assume that it is desired to fabricate a field-effect transistor on a gallium arsenide substrate. In this instance, a device similar to that illustrated in FIG. 3 is produced by forming a 5000 A. thick silicon dioxide layer over an n-type gallium arsenide substrate having a device region 22 with a thickness of 1000 A. A gate electrode 23 of molybdenum is formed within the device region and a 3000 A. thick layer of zinc doped borosilicate glass containing about one molar percent by weight of zinc is deposited thereover. The substrate is placed in a diffusion chamber and the temperature elevated to 700° C. for about 30 minutes. During this time the zinc doped borosilicate glass melts-through the thinner region of silicon dioxide glass to produce source and drain diffusion regions 25 and 26, respectively, of p-type conductivity to a depth of about one micron. Contacts are then made to the source and drain regions and the gate electrode to produce a field-effect transistor.

From the foregoing description of an embodiment of the invention, it is readily apparent to those skilled in the art that a new and useful diffusion process for modifying the conductivity of insulated semiconductor substrates is disclosed. This method not only reduces the diffusion times by an order of magnitude more than comparable prior art processes, but also eliminates stresses between the semiconductor substrate and an overlying oxide at elevated temperatures.

While the invention has been set forth herein with respect to specific examples and embodiments thereof, many modifications and changes will readily occur to those skilled in the art. Therefore, it is intended that the appended claims cover all such changes and modifications as fall within the true spirit and scope of the invention.

What I claim as new and desire to secure by Letters Patent of the United States is:

1. A glass melt-through diffusion process comprising the steps of:

forming an insulating glass layer of silicon dioxide having at least one region of thickness of less than approximately 2000 A. over a semiconductor material;

depositing a boron trioxide doped silicon dioxide glass layer having a thickness of at least approximately 2000 A. and containing approximately 20–50 molar percent boron trioxide over the insulating glass layer; and heating the semiconductor material and glass layers to a temperature between about 800° C. and 1300° C. to cause dissolution of the silicon dioxide insulating glass layer by the boron trioxide doped silicon dioxide glass layer thereby causing boron trioxide to move rapidly to the surface of the semiconductor material in said at least one region whereupon free boron atoms diffuse into the semiconductor material.

2. The process of claim 1 wherein said insulating glass layer has a region of first thickness through which boron trioxide moves to the surface of the semiconductor material and a region of a second thickness which masks the movement of boron trioxide to the surface of the semiconductor material during said heating step.

3. The process of claim 1 wherein said at least one region of the insulating glass layer has a thickness of between approximately 400 A. and 2000 A.

4. The process of claim 1 wherein said boron trioxide doped glass layer has a thickness of between approximately 2000 A. and 10,000 A.

5. The process of claim 1 wherein the step of heating the semiconductor material is performed for between approximately 5 minutes and 5 hours.

References Cited

UNITED STATES PATENTS

| | | | |
|---|---|---|---|
| 3,560,810 | 2/1971 | Katonah et al. | 117—215 |
| 3,226,612 | 12/1965 | Haenichen | 148—188 X |
| 2,794,846 | 6/1957 | Fuller | 148—188 X |
| 3,066,052 | 11/1962 | Howard | 148—188 X |

TOBIAS E. LEVOW, Primary Examiner

J. COOPER, Assistant Examiner

U.S. Cl. X.R.

117—215; 148—187